United States Patent
Hirata et al.

(10) Patent No.: US 6,847,546 B2
(45) Date of Patent: Jan. 25, 2005

(54) HIGH-SENSITIVITY MAGNETIC FIELD SENSOR

(75) Inventors: Kazuto Hirata, Tsukuba (JP); Shuichi Ooi, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 10/483,777
(22) PCT Filed: Jan. 24, 2003
(86) PCT No.: PCT/JP03/00662
§ 371 (c)(1), (2), (4) Date: Jan. 14, 2004
(87) PCT Pub. No.: WO03/063260
PCT Pub. Date: Jul. 31, 2003

(65) Prior Publication Data
US 2004/0160815 A1 Aug. 19, 2004

(30) Foreign Application Priority Data
Jan. 24, 2002 (JP) ........................ 2002-015077

(51) Int. Cl.[7] ........................... G11C 11/44; G11C 11/15
(52) U.S. Cl. ........................................ 365/162; 365/173
(58) Field of Search ............................... 365/162, 173, 365/171; 324/248

(56) References Cited

U.S. PATENT DOCUMENTS

| | | | |
|---|---|---|---|
| 5,227,721 A | * | 7/1993 | Kataoka et al. ............. 324/248 |
| 5,472,934 A | | 12/1995 | Akoh et al. |
| 5,600,243 A | * | 2/1997 | Colclough ................. 324/248 |
| 6,016,433 A | * | 1/2000 | Mizuno et al. ............. 505/190 |
| 6,372,368 B1 | * | 4/2002 | Alvarez et al. ............. 428/697 |

FOREIGN PATENT DOCUMENTS

| | | |
|---|---|---|
| EP | 637088 | 2/1995 |
| JP | 7-229929 | 8/1995 |

OTHER PUBLICATIONS

K. Hirata et al., "Josephson Vortices in $Bi_2Sr_2CaCu_2O_{8+\delta}$ single crystal", Physica C, Oct. 15, 2002, vol. 382. No. 1, pp. 142–146.

* cited by examiner

*Primary Examiner*—Anh Phung
(74) *Attorney, Agent, or Firm*—Wenderoth, Lind & Ponack, L.L.P.

(57) ABSTRACT

There is provided a high sensitive magnetic field sensor which has a Josephson junction section (2) using a bismuth 2212 oxide high-temperature superconductor single-crystal (1) and is operated based on a periodical variation in a Josephson vortex flow resistance and in which the variation is caused by an electric current which is passed vertical to a Josephson junction surface and, at the same time, a magnetic field which is applied approximately parallel to the Josephson junction surface. The sensor detects a corresponding magnetic field, using a curve which represents a relation between a Josephson vortex flow resistance and a magnetic field and has been obtained beforehand by measurements, and a resistance value which is measured in a state in which an electric current is passed, and can observe a little change of magnetic field in a high magnetic field area.

9 Claims, 3 Drawing Sheets

HIGH-SENSITIVITY MAGNETIC FIELD SENSOR

TECHNICAL FIELD

The invention according to the application relates to a high sensitive magnetic field sensor. More specifically, the invention according to the application relates to the high sensitive magnetic field sensor which can observe a little change of magnetic field in a high magnetic field area.

BACKGROUND ART

Conventionally, a hall element with using a semiconductor has generally has been used for detection of the magnetic field. But the detected minimum magnetic field strength of a two-dimensional electron-gas hall element with the best sensitivity is only approximately $10^{-3}$ Gauss. There is a superconducting quantum interference device (SQUID) as a magnetic field sensor with further better sensitivity than that of the hall element, and the SQUID can detect a magnetic field strength of $10^{-7}$ Gauss.

However, the SQUID has had various kinds of problems such as: (a) a problem that it can be used only in a low magnetic field area; (b) one that a magnetic shield is required; and (c) one that it is required to be operated at the liquid helium temperature.

Accordingly, the invention according to the application has been made, considering the above circumstances, and the object of the invention is to solve problems of the prior arts and to provide a high sensitive magnetic field sensor which can observe a little change of magnetic field in the high magnetic field area.

DISCLOSURE OF THE INVENTION

In order to solve the above problems, there is provided, as a first aspect of the invention according to the application, a high sensitive magnetic field sensor which has a Josephson junction section using a superconductive conductor and is operated based on a periodical variation in a Josephson vortex flow voltage and in which the variation is caused by an electric current which is passed vertical to the Josephson junction surface and, at the same time, a magnetic field which is applied approximately parallel to the Josephson junction surface, wherein a corresponding magnetic field is configured to be detected, using a curve which represents a relation between a Josephson vortex flow voltage and a magnetic field and has been obtained beforehand by measurements, and a voltage value which is measured in a state in which an electric current is passed.

Secondly, there is provided, as a second aspect of the invention according to the application, a high sensitive magnetic field sensor according to the first aspect of the invention, in which the superconductive conductor is an oxide high-temperature superconductor.

Thirdly, there is provided, as a third aspect of the invention according to the application, a high sensitive magnetic field sensor according to the second aspect of the invention, in which the oxide high-temperature superconductor is a $Bi_2Sr_2CaCu_2O_x$ (Bismuth 2212) compound oxide high-temperature superconductor.

Fourthly, there is provided, as a fourth aspect of the invention according to the application, a high sensitive magnetic field sensor according to any one of the first through third aspects of the invention, in which a period of the variation in the Josephson vortex flow voltage is determined by a width of the Josephson junction surface which is perpendicular to the direction of the magnetic field and that of the electric current applied to the Josephson junction surface, and the period is inversely proportional to the width of the Josephson junction surface.

Fifthly, there is provided, as a fifth aspect of the invention according to the application, a high sensitive magnetic field sensor according to any one of the first through fourth aspects of the invention, in which the electric current which is passed vertical to the Josephson junction surface has an electric current density of 100 $A/cm^2$ or less.

Sixthly, there is provided, as a sixth aspect of the invention according to the application, a high sensitive magnetic field sensor according to any one of the first through fifth aspects of the invention, in which an inclination of the applied magnetic field to the Josephson junction surface is within 0.3 degrees.

Seventhly, there is provided, as a seventh aspect of the invention according to the application, a high sensitive magnetic field sensor according to any one of the third through sixth aspects of the invention, in which the $Bi_2Sr_2CaCu_2O_x$ compound oxide high-temperature superconductor undergoes at least one of processing, within a range where the characteristics are not damaged, among composition adjustment, elemental addition or elemental substitution, control of oxygen concentration, injection of quasi particles or Cooper pairs, and substitution of other high-temperature superconductors with a unique Josephson junction structure in a laminated state.

Eighthly, there is provided, as an eighth aspect of the invention according to the application, a high sensitive magnetic field sensor according to the first aspect of the invention, in which the Josephson junction section has a superconducting multilayer structure with an iterative structure of a superconducting layer—an insulating layer—a superconducting layer.

Ninthly, there is provided, as a ninth aspect of the invention according to the application, a high sensitive magnetic field sensor according to any one of the first through eighth aspects of the invention, in which the operation temperature is equal to or lower than the superconducting transition temperature.

Figure 1:
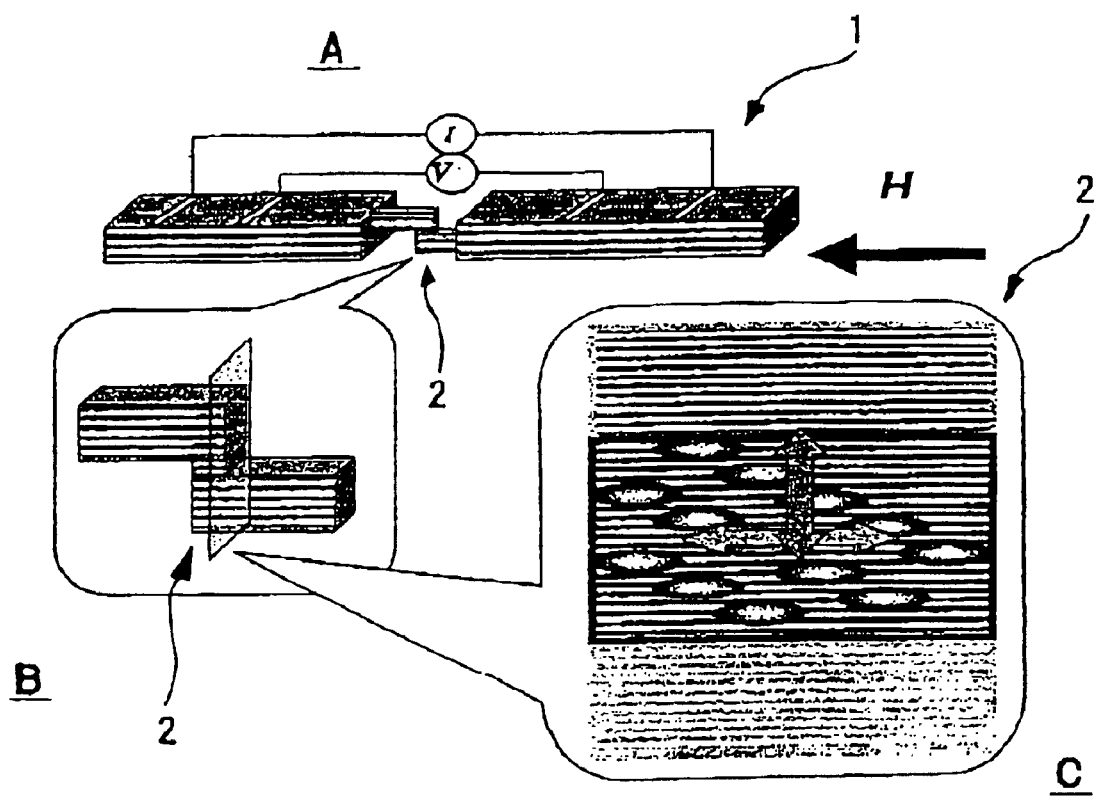
FIGS. 1A, 1B and 1C are an explanatory schematic view of a high sensitive magnetic field sensor in an example according to the invention.

Here, reference numerals in the drawings denote the following:

1 bismuth 2212 oxide high-temperature superconductor single-crystal; and 2 a Josephson junction section.

BEST MODE FOR CARRYING OUT THE INVENTION

A high sensitive magnetic field sensor according to the invention of the application is a magnetic field sensor which has a Josephson junction section using a superconductive conductor and is operated based on a periodical variation in a Josephson vortex flow voltage, wherein the variation is caused by an electric current which is passed vertical to the Josephson junction surface and, at the same time, a magnetic field which is applied approximately parallel to the Josephson junction surface, and a corresponding magnetic field is detected, using a curve which represents a relation between a Josephson vortex flow voltage and a magnetic field and has been obtained beforehand by measurement, and a voltage value which is measured in a state in which an electric current is passed.

That is, the high sensitive magnetic field sensor according to the invention of the application measures a voltage value which changes corresponding to a little change of magnetic field and can detect a change in the corresponding magnetic field by using a change in the measured voltage and the curve which represents a relation between a Josephson vortex flow voltage and a magnetic field and has been obtained beforehand.

Moreover, since a Josephson vortex flow resistance corresponding a Josephson vortex flow voltage is caused by the above method, a change in a corresponding magnetic field can be obviously detected by using the curve which represents a relation between a Josephson vortex flow resistance and a magnetic field, and a change in the measured resistance which is measured in a state in which an electric current is passed.

At this time, a Josephson junction structure, which exists in the oxide high-temperature superconductor single-crystal, in a laminated state can be used by using, especially, an oxide high-temperature superconductor single-crystal such as a $Bi_2Sr_2CaCu_2O_x$ compound oxide high-temperature superconductor as a superconductive conductor.

For example, the Josephson junction section can be formed by fine processing of the oxide high-temperature superconductor, and the Josephson vortex flow voltage (resistance) is caused by passing of an electric current vertical to the Josephson junction surface, by applying a magnetic field approximately parallel to the Josephson junction surface and by driving the Josephson vortex with the electric current passed vertical to the Josephson junction surface. Then, a periodical variation in a Josephson vortex flow voltage (resistance) is observed, wherein the variation is caused by a quantized Josephson vortex which enters into or goes out of the Josephson junction section one by one, and the curve representing a relation between a Josephson vortex flow voltage and a magnetic field is obtained.

The change in the corresponding magnetic fields can he detected by using the curve which represents relations between Josephson vortex flow voltages (resistances) and changes in the measured voltages (resistances) which are measured in a state in which an electric current is passed. Accordingly, the high sensitive magnetic field sensor which can observe a little change of magnetic field can be obtained.

Here, a physical value of one Josephson vortex which has bee quantized is equal to $2.07 \times 10^{-7}$ Gauss·cm$^2$ and, in the high sensitive magnetic field sensor according to the invention of the application, the number of the Josephson vortices can be measured, using the area of the junction section.

Figure 3:
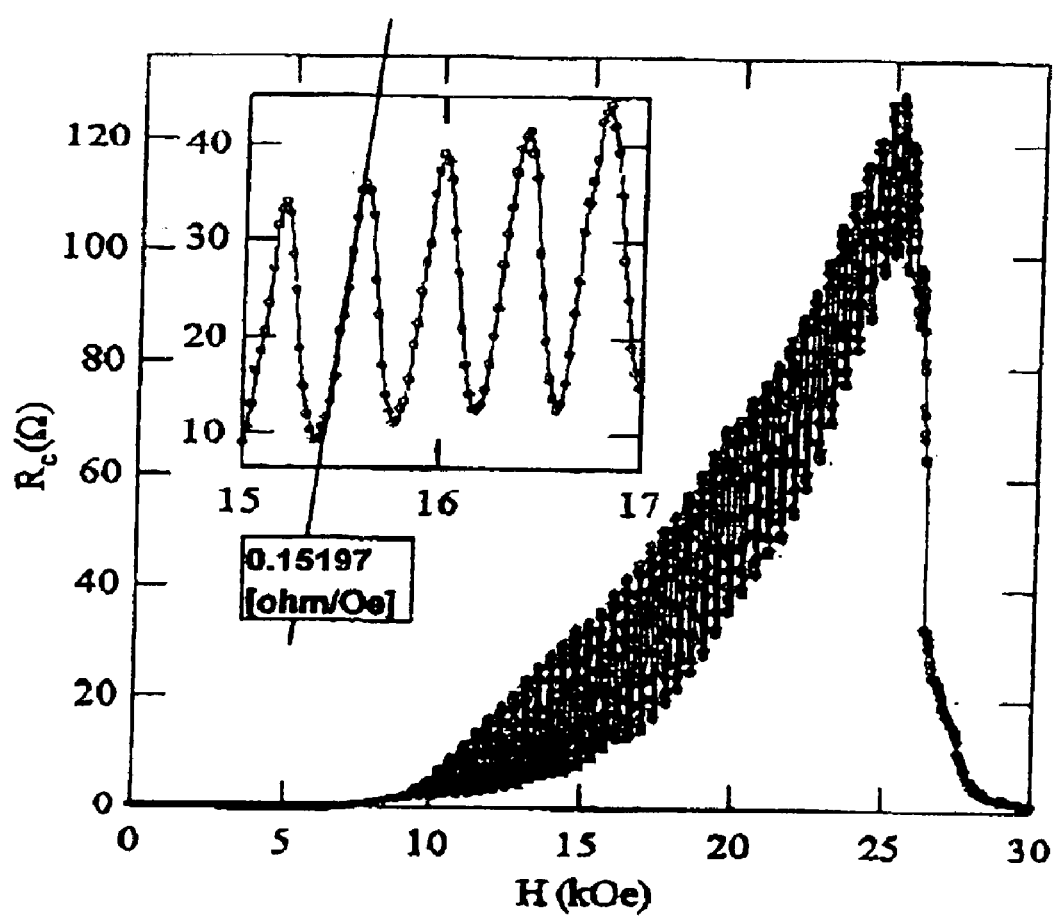
FIG. 3 is a graph showing a curve which represents a relation between a Josephson vortex flow resistance and a magnetic field in the invention.

For example, 0.15197 ohm/Oe is obtained as an inclination of the resistance to the magnetic field, using the curve, shown in FIG. 3, which represents a relation between a Josephson vortex flow resistance and a magnetic field, and a relation of $(1 \times 10^{-9}$ ohm$)/(0.15197$ ohm/Oe$) < 1 \times 10^{-8}$ Oe is obtained, considering that a piece of ordinarily-available resistance measuring apparatus with good sensitivity has a sensitivity of $1 \times 10^{-9}$ ohm or less. In this case the sensor can detect the magnetic field with an accuracy of smaller than $1 \times 10^{-8}$ Gauss. Then, the little change of the magnetic field can be observed.

It is seen that the period of the periodical variation appearing in the Josephson vortex flow voltage (resistance) is inversely proportional to a width of the Josephson junction surface which is perpendicular to the direction of the magnetic field and that of the electric current applied to the Josephson junction surface, because the period is proportional to an increment of the magnetic field, wherein the increment is caused when one Josephson vortex enters into one Josephson junction section. Accordingly, the period of the variation can be controlled by limiting of the width and the accuracy of the high sensitive magnetic field sensor according to the application can be controlled by adjusting of the period.

When the electric current which is passed vertical to the Josephson junction surface has an electric current density of 100 A/cm$^2$ or less and the inclination of the magnetic field to the Josephson junction surface is within 0.3 degrees, a periodical variation in the Josephson vortex flow voltage (resistance) is preferably observed.

Moreover, SQUID used as a high sensitive magnetic field sensor is operated at a temperature of lower than the liquid helium temperature (4.2 K). On the other hand, the high sensitive magnetic field sensor according to the invention of this application is operated from just under several K from the superconducting transition temperature. When the oxide superconductor is used, the sensor is adequately operated even at the liquid nitrogen temperature (77 K). Then, the sensor is cheaper than SQUID and can be used more easily than SQUID.

Furthermore, the high sensitive magnetic field sensor according to the invention of the application can be used even in a high magnetic field area and a magnetic shield is not required, though SQUID can be used only in a low magnetic field area and the magnetic shield is required.

Moreover, the high sensitive magnetic field sensor according to the invention of the application can be of the $Bi_2Sr_2CaCu_2O_x$ compound oxide high-temperature superconductor after at least one of processing, within a range where the characteristics are not damaged, among composition adjustment, elemental addition or elemental substitution, control of oxygen concentration, injection of quasi particles or Cooper pairs, and substitution of other high-temperature superconductors with a unique Josephson junction structure in a laminated state. Especially, the injection of quasi particles or Cooper pairs is effective for a method by which carrier density determining coupling between the superconductive layers is controlled and the above ones can be used for a method by which the period of the variation in the Josephson vortex flow voltage (resistance) is controlled.

Furthermore, the high sensitive magnetic field sensor according to the invention of the application may have a Josephson junction section provided with a conventional superconducting iterative multilayer structure with a structure of a superconducting layer—an insulating layer—a superconducting layer.

Moreover, the operation temperature for the high sensitive magnetic field sensor according to the invention of the application is equal to or lower than the superconducting transition temperature when the Josephson junction section is either of oxide high-temperature superconductor single-crystal such as a $Bi_2Sr_2CaCu_2O_x$ compound oxide high-temperature superconductor or of a conventional superconducting iterative multilayer structure with a structure of a superconducting layer—an insulating layer—a superconducting layer.

According to the principle of operation of the high sensitive magnetic field sensor according to the invention of the application, an artificial laminated layer comprising a superconducting layer, an insulating layer, and a superconducting layer is not required to be formed and oxide high-temperature superconductor single-crystal can be used as it is. In addition, the fine processing technology, which has been conventionally used, using ion beams can be also adopted for the fine processing of the oxide high-temperature superconductor single-crystal and many of technical problems have been solved, for example, because an electrode for control can be also formed by a conventional method.

Hereinafter, an embodiment according to the invention of the application will be more specifically explained, showing an example with appended drawings. Obviously, the invention is not limited to the following example and various kinds of variations in the details can be executed.

EXAMPLE

The characteristics of a high sensitive magnetic field sensor according to the invention of the application were evaluated, using a bismuth 2212 ($Bi_2Sr_2CaCu_2O_x$) oxide high-temperature superconductor single-crystal.

In the first place, a unique Josephson junction section (2) was processed by converging ion beams as shown in FIG. 1(B) in detail after the bismuth 2212 oxide high-temperature superconductor single-crystal (1) was cut in a strip shape as shown in FIG. 1(A). FIG. 1(C) is a cutaway view of the unique Josephson junction section (2), and, with regard to arrows in FIG. 1(C), an arrow in the vertical direction represents the direction of the electric current and one in the crosswise direction represents the direction of the magnetic field.

Figure 2:
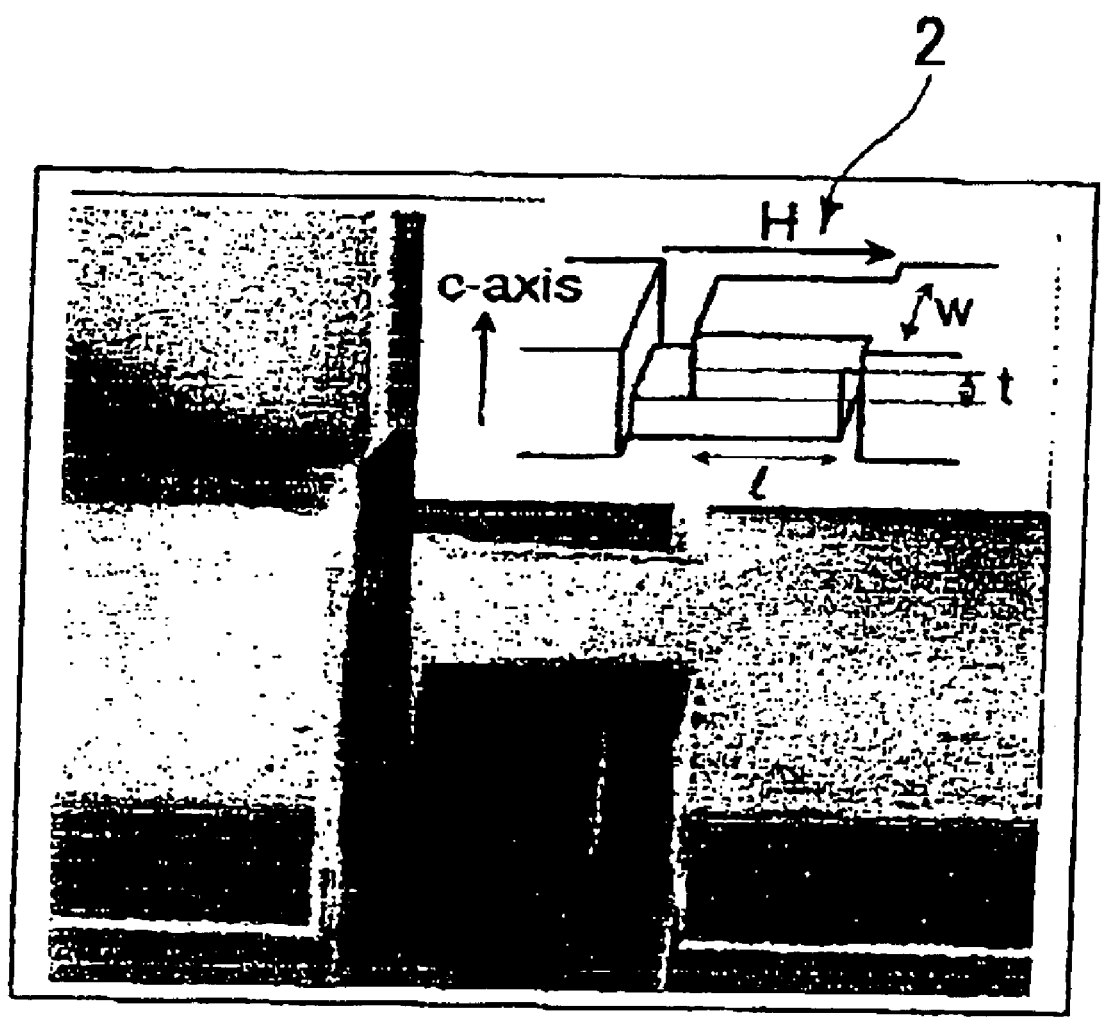
FIG. 2 is another schematic view of the high sensitive magnetic field sensor in the example according to the invention.

FIG. 2 shows a photograph of the unique Josephson junction section (2) after fine processing. The dimension of the junction section (2) are as follows: the width (W in the inserted drawing); 18 $\mu$m×the length (l in the inserted drawing); 16 $\mu$m×the height (t in the inserted drawing); 2 $\mu$m. The electric current was passed in the height direction, that is, in the vertical direction to the Josephson junction surface (superconducting layer surface) and the magnetic field was applied to the Josephson junction surface almost in the parallel direction.

The inserted drawing in FIG. 2 shows a schematic view of the unique Josephson junction section (2) which was used in the example and the Josephson junction surface is vertical to the c-axis. The direction of the magnetic field actually has an inclination of approximately 0.02 degrees to the Josephson junction surface and the magnitude of the electric current passed vertical to the Josephson junction surface is 1 $\mu$A.

As shown in FIG. 1(A), the Josephson vortex flow resistance was measured by a four-terminal measurement method using an alternating current resistance bridge LR-700. FIG. 3 shows a change in the Josephson vortex flow resistance caused by increase of the magnetic field at a temperature of 65 K. Here, the magnitude of the magnetic field is plotted in a horizontal axis and the resistance in a vertical axis of FIG. 3.

The Josephson vortex flow resistance starts to appear when the magnitude of the magnetic field is in the region of 3 kOe, and the periodical variation in the Josephson vortex flow resistance starts to be recognized in the vicinity of 7 kOe. As shown in the inserted drawing in FIG. 3, the periodical variation in the Josephson vortex flow resistance has a constant period of approximately 0.4 kOe and the periodical variation is recognized in the magnetic field with a wide range up to approximately 25 kOe. The variation is stopped in the vicinity of 25 kOe because pancake vortices are caused by a vortex which vertically enters on the Josephson junction surface with some inclinations of the magnetic field to the Josephson junction surface and the Josephson vortex flow stops by pinning caused by the pancake vortices.

A fact that the period of the variation is approximately 0.4 kOe corresponds to a fact that one Josephson vortex enters every two Josephson junction sections which exist in the bismuth 2212 oxide high-temperature superconductor single-crystal. That is, the Josephson vortex flow resistance will be remarkably changed by one Josephson vortex which enters into or goes out the Josephson junction section.

An inclination of the Josephson vortex flow resistance to the magnetic field during one period has been obtained in the example shown in FIG. 3 and the inclination is 0.15197 ohm/Oe. Then a relation of $(1\times10^{-9}$ ohm$)/(0.15197$ ohm/Oe$)<1\times10^{-8}$ Oe is obtained, considering that a piece of ordinarily-available resistance measuring apparatus with good sensitivity has a sensitivity of $1\times10^{-9}$ ohm or less. That is, the magnetic field can be detected with an accuracy of $1\times10^{-8}$ Gauss, which shows that a little change of the magnetic field can be observed.

Moreover, the number of the Josephson vortices can be measured because one Josephson vortex corresponds to $2.07\times10^{-7}$ Gauss cm$^2$.

INDUSTRIAL APPLICABILITY

As explained above in detail, according to the inventing of the application a little change of magnetic field in a high magnetic field area can be observed, and there is provided a high sensitive magnetic field sensor which may be expected to be used widely as a sensor such as a measuring instrument which observes a change in a magnetization state of a sample. Moreover, it is considered that development of peripheral technologies will be promoted, because development of products, which installs the high sensitive magnetic field sensor according to the invention of the application, for general users and that of circuit elements and the like which make use of the high sensitive magnetic field sensor according to the invention of the application will be actively executed.

What is claimed is:

1. A high sensitive magnetic field sensor which has a Josephson junction section using a superconductive conductor and is operated based on a periodical variation in a Josephson vortex flow voltage and in which the variation is caused by an electric current which is passed vertical to a Josephson junction surface and, at the same time, a magnetic field which is applied approximately parallel to the Josephson junction surface, wherein
   a corresponding magnetic field is configured to be detected, using a curve which represents a relation between a Josephson vortex flow voltage and a magnetic field and has been obtained beforehand by measurements, and a voltage value which is measured in a state in which an electric current is passed.

2. The high sensitive magnetic field sensor according to claim 1, wherein the superconductive conductor is an oxide high-temperature superconductor.

3. The high sensitive magnetic field sensor according to claim 2, wherein the oxide high-temperature superconductor is a $Bi_2Sr_2CaCu_2O_x$ compound oxide high-temperature superconductor.

4. The high sensitive magnetic field sensor according to any one of claim 1, wherein a period of the variation in the Josephson vortex flow voltage is determined by a width of the Josephson junction surface which is perpendicular to the direction of the magnetic field and that of the electric current applied to the Josephson junction surface, and the period is inversely proportional to the width of the Josephson junction surface.

5. The high sensitive magnetic field sensor according to any one of claim 1, wherein the electric current which is passed vertical to the Josephson junction surface has an electric current density of 100 A/cm$^2$ or less.

6. The high sensitive magnetic field sensor according to claim 1, wherein an inclination of the applied magnetic field to the Josephson junction surface is within 0.3 degrees.

7. The high sensitive magnetic field sensor according to claim 3, wherein

The $Bi_2Sr_2CaCu_2O_x$ compound oxide high-temperature superconductor undergoes at least one of processing, within a range where the characteristics are not damaged, among composition adjustment, elemental addition or elemental substitution, control of oxygen concentration, injection of quasi particles or Cooper pairs, and substitution of other high-temperature superconductors with a unique Josephson junction structure in a laminated state.

8. The high sensitive magnetic field sensor according to claim 1, wherein the Josephson junction section has a superconducting multilayer structure with an interative structure of a superconducting layer—an insulating layer—a superconducting layer.

9. The high sensitive magnetic field sensor according to claim 1, wherein the operation temperature is equal to or lower than the superconducting transition temperature.

* * * * *